United States Patent
Shon

(10) Patent No.: US 8,692,604 B2
(45) Date of Patent: Apr. 8, 2014

(54) IMPEDANCE CALIBRATION CIRCUIT

(75) Inventor: Kwan Su Shon, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/601,850

(22) Filed: Aug. 31, 2012

(65) Prior Publication Data

US 2013/0154689 A1    Jun. 20, 2013

(30) Foreign Application Priority Data

Dec. 19, 2011 (KR) .................. 10-2011-0137483

(51) Int. Cl.
*H03L 5/00* (2006.01)
*H03K 19/003* (2006.01)

(52) U.S. Cl.
USPC .............. 327/308; 333/81 R; 326/30

(58) Field of Classification Search
USPC ............ 327/306, 308, 90, 108; 333/81 R; 326/30
See application file for complete search history.

(56) References Cited

U.S. PATENT DOCUMENTS

| 7,382,153 | B2 * | 6/2008 | Ou-yang et al. | 326/30 |
| 7,692,446 | B2 * | 4/2010 | Lee et al. | 326/30 |
| 7,804,323 | B2 * | 9/2010 | Kim et al. | 326/30 |
| 7,863,946 | B2 * | 1/2011 | Ozasa | 327/108 |

* cited by examiner

*Primary Examiner* — Dinh T. Le
(74) *Attorney, Agent, or Firm* — William Park & Associates Patent Ltd.

(57) ABSTRACT

An impedance calibration circuit may include a first reference voltage generator configured to generate a first reference voltage in response to reference voltage calibration signals, a second reference voltage generator configured to provide a second reference voltage as a conversion voltage, an impedance calibration signal generator configured to compare the conversion voltage with the first reference voltage and generate impedance calibration signals when an enable signal is activated, and a register configured to store the impedance calibration signals finally calibrated and generate reference voltage calibration signals in response to the stored impedance calibration signals.

14 Claims, 4 Drawing Sheets

IMPEDANCE CALIBRATION CIRCUIT

CROSS-REFERENCES TO RELATED APPLICATION

The present application claims priority under 35 U.S.C. §119(a) to Korean application number 10-2011-0137483, filed on Dec. 19, 2011, in the Korean Intellectual Property Office, which is incorporated herein by reference in its entirety.

BACKGROUND

1. Technical Field

The present embodiments relate generally to a semiconductor circuit and to an impedance calibration circuit.

2. Related Art

The resistance value of the output driver of a semiconductor circuit may have a varying target level depending on a change in the PVT process, voltage, and temperature. This may lead to the loss of a transmitted signal due to the generation of a reflected wave resulting from the impedance mismatching of a transmission line.

Furthermore, this impedance mismatching may become more severe as current systems require high speed and low power.

Accordingly, in semiconductor circuits, technology for calibrating impedance to a target level acts as an important factor for determining performance.

SUMMARY

An impedance calibration circuit capable of improving impedance calibration performance is described herein.

In an embodiment, an impedance calibration circuit includes a first reference voltage generator configured to generate a first reference voltage in response to reference voltage calibration signals, a second reference voltage generator configured to provide a second reference voltage as a conversion voltage, an impedance calibration signal generator configured to compare the conversion voltage with the first reference voltage and generate impedance calibration signals when an enable signal is activated, and a register configured to store the impedance calibration signals finally calibrated and generate reference voltage calibration signals in response to the stored impedance calibration signals.

BRIEF DESCRIPTION OF THE DRAWINGS

Features, aspects, and embodiments are described in conjunction with the attached drawings, in which.

DETAILED DESCRIPTION

Hereinafter, an impedance calibration circuit will be described below with reference to the accompanying drawings through exemplary embodiments.

The figures are provided to allow those having ordinary skill in the art to understand the scope of the embodiments of the disclosure. The present embodiments may, however, be embodied in different forms and should not be construed as limited to the embodiments set forth herein. Rather, these embodiments are provided so that this disclosure will be thorough and complete, and will fully convey the scope of the present invention to those skilled in the art.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

First, an impedance calibration circuit 100 according to an embodiment is described below with reference to FIGS. 1 and 2.

Figure 1:
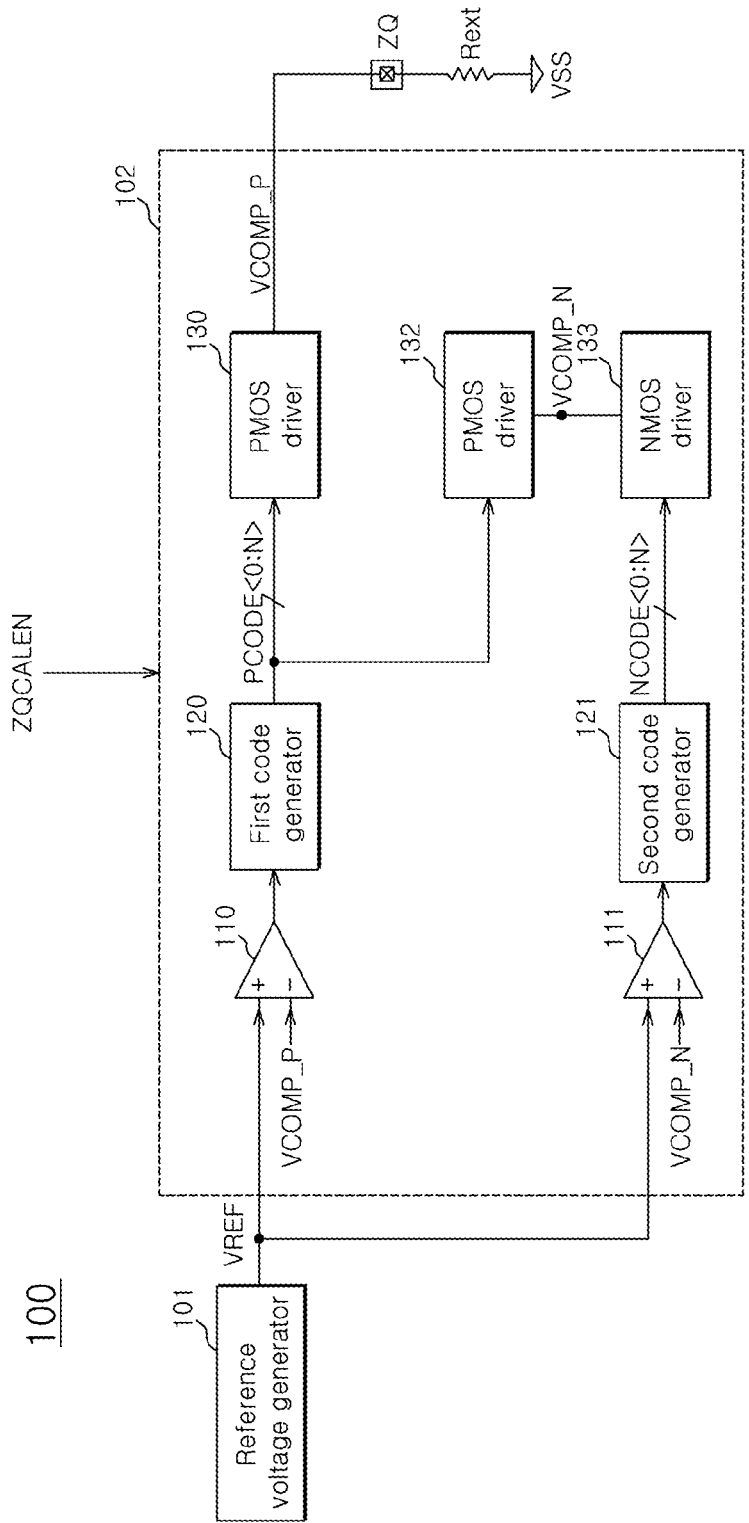
FIG. 1 is a block diagram of an example of an impedance calibration circuit according to an embodiment.

As illustrated in FIG. 1, the impedance calibration circuit 100 according to an embodiment may include a reference voltage generator 101 and an impedance calibration signal generator 102.

The reference voltage generator 101 may be configured to generate a reference voltage VREF.

The impedance calibration signal generator 102 may be connected to an external resistor Rext through a pad ZQ.

The impedance calibration signal generator 102 may be may be configured to compare conversion voltages VCOMP_P and VCOMP_N with the reference voltage VREF and may generate respective impedance calibration signals PCODE<0:N> and NCODE<0:N> during the activation section of an impedance calibration enable signal ZQCALEN.

The impedance calibration signal generator 102 may include a first comparator 110, a first code generator 120, a second comparator 111, a second code generator 121, PMOS drivers 130 and 132, and an NMOS driver 133.

The first comparator 110 may be configured to compare the conversion voltage VCOMP_P with the reference voltage VREF and may generate an output signal corresponding to a result of the comparison.

The first code generator 120 may be configured to increase or decrease the value of the impedance calibration signals PCODE<0:N> in response to the output signal of the first comparator 110.

The PMOS driver 130 may include a plurality of PMOS transistors and a plurality of resistors.

The PMOS driver 130 may be configured to distribute external voltage VDD at a distribution ratio of the calibrated internal resistance value of the PMOS driver 130 and the resistance value of the external resistor Rext and may output a distributed voltage as the conversion voltage VCOMP_P, in response to the impedance calibration signals PCODE<0:N>.

The second comparator 111 may be configured to compare the conversion voltage VCOMP_N with the reference voltage VREF and may generate an output signal corresponding to a result of the comparison.

The second code generator 121 may be configured to increase or decrease the value of the impedance calibration signals NCODE<0:N> in response to the output signal of the second comparator 111.

The PMOS driver 132 may be a duplication circuit of the PMOS driver 130, and the internal resistance value of the PMOS driver 132 may be calibrated in response to the calibrated impedance calibration signals PCODE<0:N>.

The NMOS driver 133 may include a plurality of NMOS transistors and a plurality of resistors.

The NMOS driver 133 may be configured to distribute the external voltage VDD at a distribution ratio of the calibrated internal resistance value of the NMOS driver 133 and the internal resistance value of the PMOS driver 132 and may output a distributed voltage as the conversion voltage VCOMP_N, in response to the impedance calibration signals NCODE<0:N>.

Figure 2:
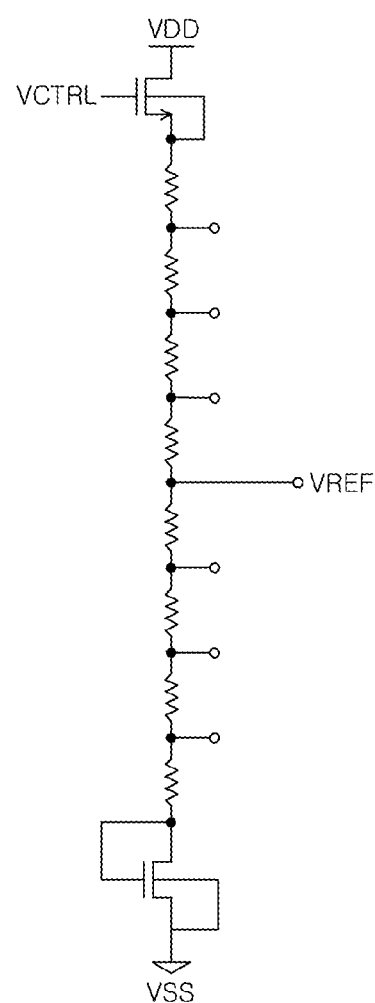
FIG. 2 is a circuit diagram of an example of a reference voltage generator illustrated in FIG. 1.

As illustrated in FIG. 2, the reference voltage generator 101 may include an NMOS transistor, a plurality of resistors, and a control signal VCTRL.

Here, the NMOS transistor may be configured in a diode-connected manner in which the source of the NMOS transistor may be connected to a bulk terminal in order to prevent a static current.

The operation of the impedance calibration circuit 100 configured as described above according to an embodiment is described below.

During the section where the impedance calibration enable signal ZQCALEN is activated, the impedance calibration signal generator 102 may be activated, thus performing an impedance calibration operation.

The PMOS driver 130 may generate the conversion voltage VCOMP_P through the distribution of a resistance value with resistance of the external resistor Rext, in response to the impedance calibration signals PCODE<0:N> having an initial value.

The comparator 110 may compare the conversion voltage VCOMP_P with the reference voltage VREF and may output a result of the comparison.

The first code generator 120 may increase or decrease the value of the impedance calibration signals PCODE<0:N> in response to the output of the comparator 110.

The above-described process may be repeated until the conversion voltage VCOMP_P becomes equal to the reference voltage VREF within a predetermined error range.

When the conversion voltage VCOMP_P becomes equal to the reference voltage VREF within the predetermined error range, the calibration of the impedance calibration signals PCODE<0:N> may be completed.

Here, when the calibration of the impedance calibration signals PCODE<0:N> is completed, it may mean that a value of the internal resistance of the PMOS driver 130 may become equal to the resistance value of the external resistor Rext.

Furthermore, the PMOS driver 132 may perform a role of the external resistor Rext by copying the impedance calibration signals PCODE<0:N> to the PMOS driver 132.

Accordingly, a process of calibrating the impedance calibration signals NCODE<0:N> may be repeated according to substantially the same method as the method of calibrating the impedance calibration signal PCODE<0:N>.

When the conversion voltage VCOMP_N becomes equal to the reference voltage VREF within a predetermined error range, the calibration of the impedance calibration signals NCODE<0:N> may be completed.

As a result, through the above-described process, the internal resistance values of the PMOS drivers 130 and 132 and the NMOS driver 133 become equal to each other and each may become equal to the resistance value of the external resistor Rext within a set error range.

Furthermore, the calibrated impedance calibration signals PCODE<0:N> and NCODE<0:N> may be provided to an input/output related circuit, for example, a data output driver so that the data output driver has a desired impedance value.

Here, the PMOS driver 132 and the NMOS driver 133 may be duplication circuits of the data output driver.

An impedance calibration circuit 200 according to another embodiment is described below with reference to FIGS. 3 to 5.

Figure 3:
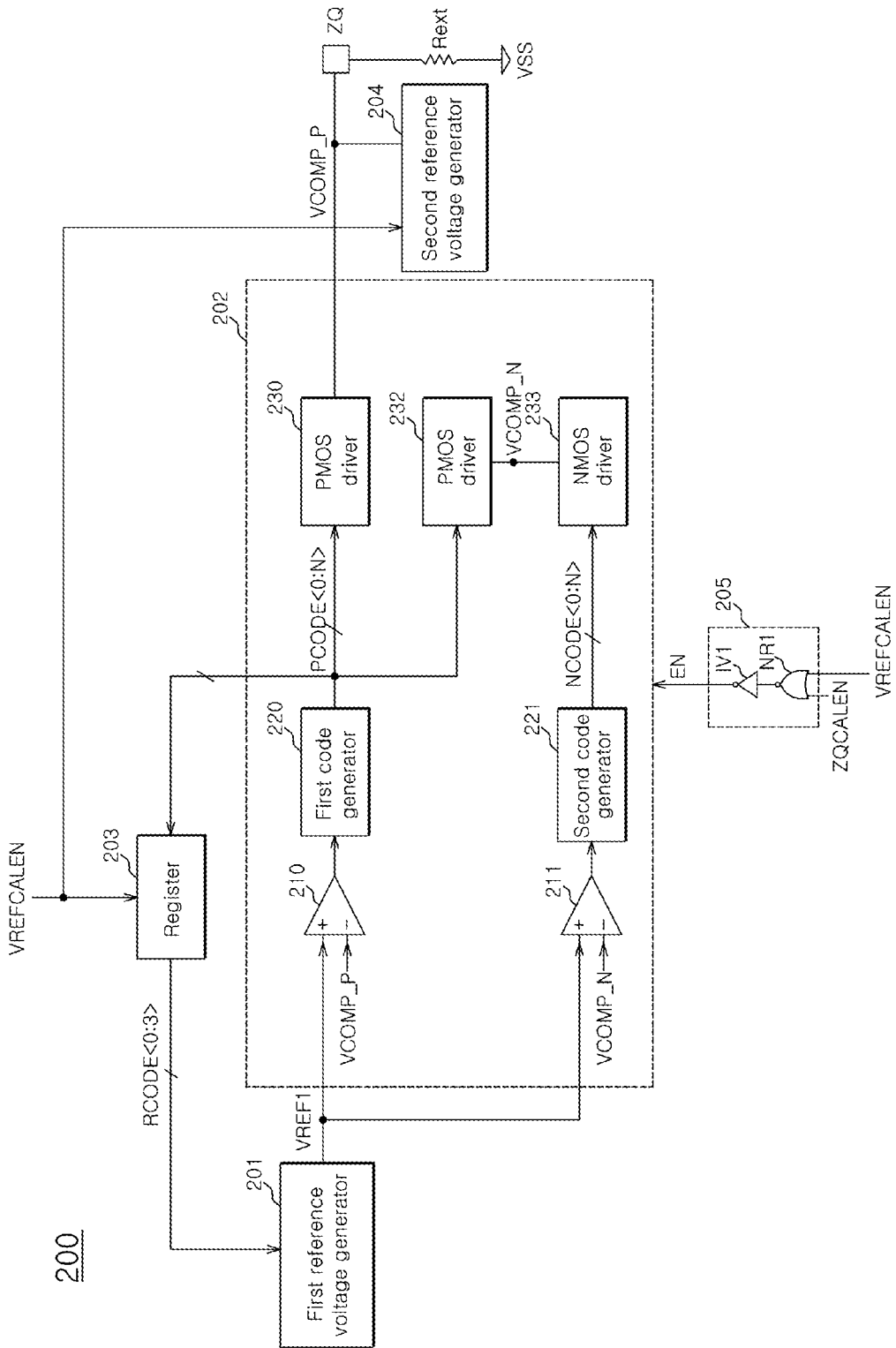
FIG. 3 is a block diagram of an example of an impedance calibration circuit according to another embodiment.

As illustrated in FIG. 3, the impedance calibration circuit 200 according to another embodiment may include a first reference voltage generator 201, an impedance calibration signal generator 202, a register 203, a second reference voltage generator 204, and a signal combination unit 205.

The first reference voltage generator 201 may be configured to generate a first reference voltage VREF1 in response to reference voltage calibration signals RCODE<0:3>.

Here, a target level of the first reference voltage VREF1 may be VDD/2 equal to half of, for example, external voltage VDD. If NMOS transistors for frequent current control are included on the upper and lower sides as in FIG. 2, however, an actual level of a reference voltage VREF may be different from VDD/2.

The second reference voltage generator 204 may be configured to supply a second reference voltage VREF2 to the impedance calibration signal generator 202 as a conversion voltage VCOMP_P during the section where a reference voltage calibration enable signal VREFCALEN may be activated.

The second reference voltage generator 204 may be designed so that the second reference voltage VREF2 may have a level almost equal to the target level VDD/2, that is, an error range between the second reference voltage VREF2 and the target level VDD/2 may be smaller than that of the first reference voltage generator 201.

The impedance calibration signal generator 202 may be connected to an external resistor Rext through a pad ZQ.

The impedance calibration signal generator 202 may be configured to compare the conversion voltages VCOMP_P and VCOMP_N with the first reference voltage VREF1 and may generate impedance calibration signals PCODE<0:N> and NCODE<0:N> during the section where an enable signal EN is activated.

The impedance calibration signal generator 202 may include a first comparator 210, a first code generator 220, a second comparator 211, a second code generator 221, PMOS drivers 230 and 232, and an NMOS driver 233.

The first comparator 210 may be configured to compare the conversion voltage VCOMP_P with the first reference voltage VREF1 and may generate an output signal corresponding to a result of the comparison.

The first code generator 220 may be configured to increase or decrease a value of the impedance calibration signal PCODE<0:N> in response to the output signal of the first comparator 210.

The PMOS driver 230 may include a plurality of PMOS transistors and a plurality of resistors.

The PMOS driver 230 may be configured to distribute the external voltage VDD at a distribution ratio of the calibrated internal resistance value of the PMOS driver 230 and the resistance value of the external resistor Rext and may output a distributed voltage as the conversion voltage VCOMP_P, in response to the impedance calibration signals PCODE<0:N>.

The second comparator 211 may be configured to compare the conversion voltage VCOMP_N with the first reference voltage VREF1 and may generate an output signal corresponding to a result of the comparison.

The second code generator 221 may be configured to increase or decrease the value of the impedance calibration signals NCODE<0:N> in response to the output signal of the second comparator 211.

The PMOS driver 232 may be a duplication circuit of the PMOS driver 230, and an internal resistance value thereof may be calibrated in response to the calibrated impedance calibration signals PCODE<0:N>.

The NMOS driver 233 may include a plurality of NMOS transistors and a plurality of resistors.

The NMOS driver 233 may be configured to distribute the external voltage VDD at a distribution ratio of the calibrated internal resistance value of the NMOS driver 233 and the internal resistance value of the PMOS driver 232 and may output a distributed voltage as the conversion voltage VCOMP_N in response to the impedance calibration signals NCODE<0:N>.

The register 203 may be configured to store finally calibrated impedance calibration signals PCODE<0:N> during the is section where the reference voltage calibration enable signal VREFCALEN may be activated and may generate the reference voltage calibration signals RCODE<0:3> based on the stored signal.

The signal combination unit 205 may be configured to activate the enable signal EN when any one of the reference voltage calibration enable signal VREFCALEN and an impedance calibration enable signal ZQCALEN may be activated.

The signal combination unit 205 may include a NAND gate NR1 and an inverter IV1.

Figure 4:
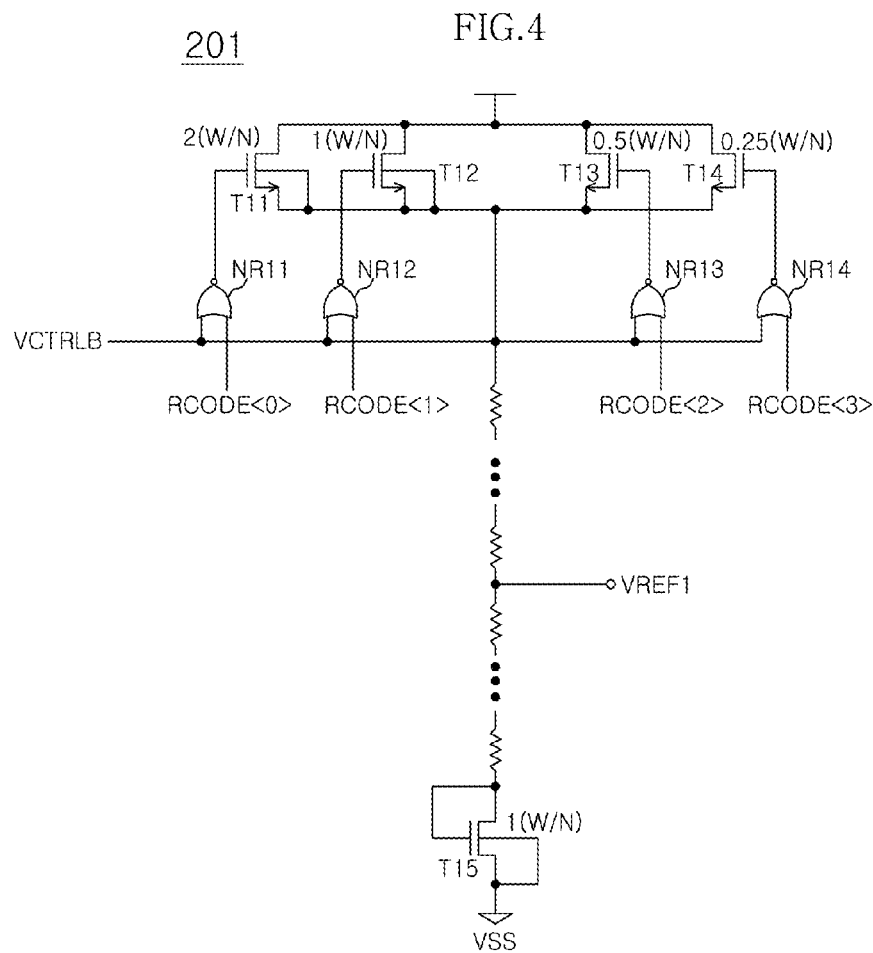
FIG. 4 is a circuit diagram of an example of a reference voltage generator illustrated in FIG. 3.

As illustrated in FIG. 4, the first reference voltage generator 201 may include a plurality of NMOS transistors T11~T15, a plurality of logic gates, that is, NOR gates NR11~NR14, and a plurality of resistors. Ground terminal VSS is also illustrated in FIG. 4.

Here, it may be assumed that the size of the NMOS transistor T15 connected to a ground terminal may be 1(W/N) and the NMOS transistors T11~T14 connected to a power supply terminal may have different sizes 2, 1, 0.5, and 0.25, respectively.

It may be assumed that the plurality of NOR gates NR11~NR14 select the NMOS transistors T11~T14 in response to the respective reference voltage calibration signals RCODE<0:3> (i.e., RCODE<0>, RCODE<1>, RCODE<2>, RCODE<3>) when a control signal VCTRLB may be activated.

When the NMOS transistors T11~T14 are selected, a level of the first reference voltage VREF1 may be controlled.

The operation of the impedance calibration circuit 200 configured as described above according to another embodiment is described below.

Figure 5:
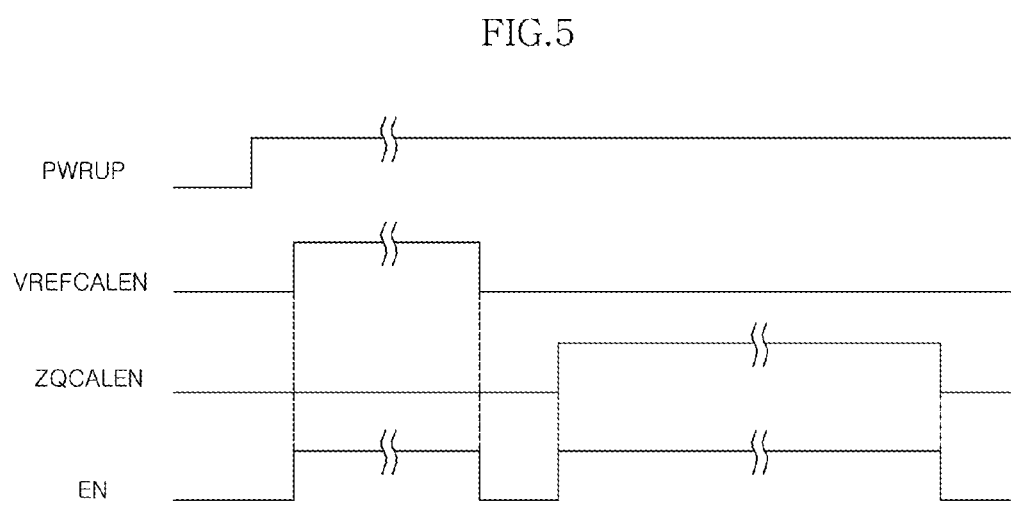
FIG. 5 is a timing diagram of signals illustrated in FIG. 3.

As illustrated in FIG. 5, a semiconductor circuit including the impedance calibration circuit 200 may recognize that power may normally be supplied when a power-up signal PWRUP is activated.

Accordingly, the impedance calibration enable signal ZQCALEN for performing an impedance calibration operation may be activated with a predetermined timing margin after the power-up signal PWRUP is activated.

In another embodiment, a reference voltage calibration operation may be performed in a marginal section between the power-up signal PWRUP and the impedance calibration enable signal ZQCALEN.

Accordingly, the reference voltage calibration enable signal VREFCALEN may be activated between the power-up signal PWRUP and the impedance calibration enable signal ZQCALEN.

Here, the activation of the reference voltage calibration enable signal VREFCALEN may be performed in such a way as to generate a signal within the circuit or may be provided in the form of an external command.

When the reference voltage calibration enable signal VREFCALEN is activated, the second reference voltage generator 204 may provide a second reference voltage VREF2 to the impedance calibration signal generator 202 as the conversion voltage VCOMP_P.

When the reference voltage calibration enable signal VREFCALEN is activated, the enable signal EN may also be activated.

The impedance calibration signal generator 202 may compare the second reference voltage VREF2 with the first reference voltage VREF1 and may perform an operation of calibrating the value of the impedance calibration signal PCODE<0:N>.

The register 203 may be designed to initially output the reference voltage calibration signals RCODE<0:3> having a value, for example, '1011'.

Next, the register 203 may calibrate the value of the reference voltage calibration signals RCODE<0:3> in response to the impedance calibration signals PCODE<0:N> calibrated during the section where the reference voltage calibration enable signal VREFCALEN may be activated. That is, the register 203 may change the value '1011' into a value '1101' or '0111' depending on an increase or decrease of the value of the impedance calibration signals PCODE<0:N>.

Accordingly, a difference between the second reference voltage VREF2 and the first reference voltage VREF1 may be incorporated into the value of the impedance calibration signals PCODE<0:N>, and the impedance calibration signals PCODE<0:N> at a point of time at which the activation section of the reference voltage calibration enable signal VREFCALEN is ended may be stored in the register 203.

Through the above process, the first reference voltage VREF1 may be calibrated so that it may approximately be equal to the target level VDD/2.

Next, during the section where the impedance calibration enable signal ZQCALEN may be activated, the impedance calibration signal generator 202 may be activated again, so that an impedance calibration operation may be performed.

The PMOS driver 230 may generate the conversion voltage VCOMP_P through the distribution of the resistance value of the PMOS driver 230 with the resistance value of the external resistor Rext in response to the impedance calibration signals PCODE<0:N> having an initial value.

The comparator 210 may compare the conversion voltage VCOMP_P with the first reference voltage VREF1 and may output a result of the comparison.

The first code generator 220 may increase or decrease the value of the impedance calibration signals PCODE<0:N> in response to the output of the comparator 210.

The above-described process may be repeated until the conversion voltage VCOMP_P becomes equal to the first reference voltage VREF1 within a predetermined error range.

When the conversion voltage VCOMP_P becomes equal to the first reference voltage VREF1 within the predetermined error range, the calibration of the impedance calibration signals PCODE<0:N> may be completed.

As a result, when the calibration of the impedance calibration signals PCODE<0:N> is completed, it may mean that the internal resistance value of the PMOS driver 230 may have become equal to the resistance value of the external resistor Rext.

Furthermore, the PMOS driver 232 may play the role of the external resistor Rext by copying the impedance calibration signals PCODE<0:N> to the PMOS driver 232.

Accordingly, a process of calibrating the impedance calibration signals NCODE<0:N> may be repeated according to the same method as the method of calibrating the impedance calibration signals PCODE<0:N>.

When the conversion voltage VCOMP_N becomes equal to the first reference voltage VREF1 within a predetermined error range, the calibration of the impedance calibration signals NCODE<0:N> may be completed.

As a result, through the above-described process, the internal resistance values of the PMOS drivers 230 and 232 and the NMOS driver 233 may become equal to each other, and each may become equal to the resistance value of the external resistor Rext within a set error range.

Furthermore, the calibrated impedance calibration signals PCODE<0:N> and NCODE<0:N> may be provided to an input/output related circuit, for example, a data output driver so that the data output driver may have a desired impedance value.

Here, the PMOS driver 132 and the NMOS driver 133 may be duplication circuits of the data output driver.

The impedance calibration circuit according to the embodiment may improve impedance calibration performance.

While certain embodiments have been described above, it will be understood to those skilled in the art that the embodiments described are by way of example only. Accordingly, the impedance calibration circuit described herein should not be limited based on the described embodiments. Rather, the embodiments have been disclosed above for illustrative purposes. Those skilled in the art will appreciate that various modifications, additions and substitutions are possible, without departing from the scope and spirit of the inventive concept as disclosed in the accompanying claims.

What is claimed is:

1. An impedance calibration circuit, comprising:
a first reference voltage generator configured to generate a first reference voltage in response to reference voltage calibration signals;
a second reference voltage generator configured to provide a second reference voltage as a conversion voltage;
an impedance calibration signal generator configured to compare the conversion voltage with the first reference voltage and generate impedance calibration signals when an enable signal, connected to the impedance calibration signal generator, is activated; and
a register configured to store the impedance calibration signals finally calibrated and generate the reference voltage calibration signals in response to the stored impedance calibration signals.

2. The impedance calibration circuit according to claim 1, further comprising a signal combination unit coupled to the impedance calibration signal generator for generating the enable signal and configured to activate the enable signal responsive to an activation of any one of a reference voltage calibration enable signal and an impedance calibration enable signal.

3. The impedance calibration circuit according to claim 2, wherein the signal combination unit includes a NAND gate and an inverter.

4. The impedance calibration circuit according to claim 2, wherein the reference voltage calibration enable signal is activated when a power-up signal is activated and when the impedance calibration enable signal is activated.

5. The impedance calibration circuit according to claim 1, wherein the first reference voltage generator comprises:
a plurality of transistors connected to a power supply terminal,
a plurality of logic gates configured to selectively operate the plurality of transistors in response to the reference voltage calibration signals, and
a plurality of resistors connected between the plurality of transistors and a ground terminal.

6. The impedance calibration circuit according to claim 5, wherein the plurality of logic gates are NOR gates configured to select the plurality of transistors in response to respective reference voltage calibration signals when a control signal is activated.

7. The impedance calibration circuit according to claim 5, wherein the plurality of transistors connected to a power supply terminal are NMOS transistors.

8. The impedance calibration circuit according to claim 5, wherein the plurality of transistors are designed to have different sizes.

9. The impedance calibration circuit according to claim 5, wherein each of the plurality of transistors have a different size.

10. The impedance calibration circuit according to claim 1, wherein the impedance calibration signal generator comprises:
a comparator configured to compare the conversion voltage with the first reference voltage and generate an output signal corresponding to a result of the comparison,
a code generator configured to increase or decrease a value of the impedance calibration signals in response to the output signal of the comparator, and
a first driver configured to distribute an external voltage at a distribution ratio of a calibrated internal resistance value of the first driver and a resistance value of an external resistor in response to the impedance calibration signals and output a distributed voltage as the conversion voltage.

11. The impedance calibration circuit according to claim 10, wherein the first driver is a PMOS driver.

12. The impedance calibration circuit according to claim 10, wherein the impedance calibration signal generator comprises:
a second comparator configured to compare a second conversion voltage with the first reference voltage and generate an output signal corresponding to a result of the comparison,
a second code generator configured to increase or decrease a value of second impedance calibration signals in response to the output signal of the second comparator,
a second driver configured to have its internal resistance value calibrated in response to the impedance calibration signals, and
a third driver configured to distribute the external voltage at a distribution ratio of a calibrated internal resistance value of the third driver and the internal resistance value of the second driver and output a distributed voltage as the second conversion voltage in response to the second impedance calibration signals.

13. The impedance calibration circuit according to claim 12, wherein the second driver is a NMOS driver.

14. The impedance calibration circuit according to claim 12, wherein the third driver is a PMOS driver.

* * * * *